(12) United States Patent
Na

(10) Patent No.: US 7,605,624 B2
(45) Date of Patent: Oct. 20, 2009

(54) DELAY LOCKED LOOP (DLL) CIRCUIT FOR GENERATING CLOCK SIGNAL FOR MEMORY DEVICE

(75) Inventor: Kwang Jin Na, Anyang-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 4 days.

(21) Appl. No.: 11/824,840

(22) Filed: Jun. 29, 2007

(65) Prior Publication Data

US 2008/0157837 A1 Jul. 3, 2008

(30) Foreign Application Priority Data

Dec. 29, 2006 (KR) .................. 10-2006-0138764

(51) Int. Cl.
*H03L 7/06* (2006.01)
(52) U.S. Cl. .................. 327/158; 327/144; 327/147; 327/154; 327/155; 327/161
(58) Field of Classification Search .................. 327/158
See application file for complete search history.

(56) References Cited

U.S. PATENT DOCUMENTS

| 6,218,876 | B1 * | 4/2001 | Sung et al. | 327/156 |
| 6,765,421 | B2 * | 7/2004 | Brox et al. | 327/175 |
| 6,894,539 | B2 | 5/2005 | Kim | |
| 6,956,418 | B2 | 10/2005 | Kwak et al. | |
| 7,154,978 | B2 * | 12/2006 | Juan et al. | 375/376 |
| 7,414,443 | B2 * | 8/2008 | Jacobsson et al. | 327/116 |
| 7,423,465 | B2 * | 9/2008 | Gomm | 327/175 |

FOREIGN PATENT DOCUMENTS

| KR | 10-1998-0078161 | 11/1998 |
| KR | 10-2003-0000477 A | 1/2003 |
| KR | 10-2004-0020990 A | 3/2004 |
| KR | 10-2004-0037786 A | 5/2004 |
| KR | 10-2005-0089474 A | 9/2005 |

* cited by examiner

*Primary Examiner*—Lincoln Donovan
*Assistant Examiner*—John W Poos
(74) *Attorney, Agent, or Firm*—John P. White; Cooper & Dunham LLP

(57) ABSTRACT

A delay locked loop (DLL) circuit is disclosed. The DLL circuit includes a first delay locked loop (DLL) configured to receive a plurality of first clock signals, delay each of the first clock signals by a predetermined period of time in response to a first control signal, and generate a plurality of first internal clock signals and a second delay locked loop (DLL) configured to receive the first internal clock signals, delay the first internal clock signals by a predetermined period of time in response to a second control signal, and generate a plurality of second internal clock signals.

20 Claims, 6 Drawing Sheets

DELAY LOCKED LOOP (DLL) CIRCUIT FOR GENERATING CLOCK SIGNAL FOR MEMORY DEVICE

BACKGROUND

The present disclosure relates to a semiconductor memory device, and more particularly to a delay locked loop (DLL) circuit.

In general, a semiconductor memory device has been continuously developed to improve an operation speed and an integration degree. Particularly, in order to increase the operation speed of the semiconductor memory device, a synchronous memory device capable of being synchronized with an external clock signal of a memory chip has recently been developed.

The above-mentioned semiconductor memory device generally uses a delay locked loop (DLL) for generating an internal clock signal acquired when an external clock signal is delayed by a predetermined period of time so that data can be correctly synchronized with a rising edge and a falling edge of the clock signal.

As described above, the delay locked loop (DLL) generates the internal clock signal in which an internal delay factor of a DRAM is compensated for the external clock signal. This above-mentioned condition is referred to as a "locking status". This locking status is indicative of a specific condition in which a reference clock signal (refclk) is synchronized with a feedback clock signal (fbclk). In this case, the conventional delay locked loop (DLL) can allow the feedback clock signal (fbclk) to be synchronized with the reference clock signal (refclk).

FIG. 1 is a block diagram illustrating a conventional delay locked loop (DLL).

Referring to FIG. 1, the conventional delay locked loop (DLL) buffers an external clock signal (CLK) via clock receiver 101, and outputs a reference clock signal (refclk). Delay line 102 delays the reference clock signal (refclk) generated from the clock receiver 10 by a predetermined period of time, and outputs the delayed reference clock signal. In this case, the delay line 102 receives a control signal of phase detector 105, and variably increases/reduces the delay period.

Internal delay 104 delays the signal received from the delay line 102 by a predetermined period of time, and outputs a feedback clock signal (fbclk).

In this case, the internal delay 104 includes a predetermined delay period acquired by modeling a first delay factor and a second delay factor. The first delay factor is generated until the external clock signal (CLK) reaches the delay line 102 via the clock receiver 101. The second delay factor is generated until data is generated.

Generally, in order to correctly enable the external clock (CLK) to be synchronized with a DQ strobe, the phase of the reference clock signal (refclk) applied to the phase detector 105 must be identical with that of the feedback clock signal (fbclk) applied to the phase detector 105.

The phase detector 105 compares the phase of the reference clock signal (refclk) with that of the feedback clock signal (fbclk), and generates a phase control signal for controlling a delay operation of the delay line 102 according to the comparison result. Therefore, the phase detector 105 maintains synchronization between the feedback clock signal (fbclk) of a feedback path and the reference clock signal (refclk), such that it generates the internal clock signal in which an internal delay component of a DRAM is compensated for the external clock signal.

However, the conventional 4-phase delay locked loop (DLL) uses analog element(s), such that it requires a large amount of power consumption, and has difficulty in guaranteeing operation characteristics at a low voltage, resulting in the occurrence of an unstable locking status.

BRIEF SUMMARY

In accordance with one aspect of the present invention, there is provided a delay locked loop (DLL) circuit comprising a first delay locked loop (DLL) configured to receive a plurality of first clock signals, delay each of the first clock signals by a predetermined period of time in response to a first control signal, and generate a plurality of first internal clock signals, and a second delay locked loop (DLL) configured to receive the first internal clock signals, delay the first internal clock signals by a predetermined period of time in response to a second control signal, and generate a plurality of second internal clock signals.

Preferably, each of the first clock signals has a phase difference of ¼ period.

Preferably, each of the first internal clock signals has a phase difference of ½ period.

Preferably, each of the second internal clock signals has a phase difference of ¼ period.

Preferably, the first control signal is based on comparing a phase of a feedback clock signal of the first internal clock signal with that of a reference clock signal, determining which one of a feedback clock signal's phase and a reference clock signal's phase is faster, and determining an amount of delay according to the determined clock signal.

Preferably, the second control signal is based on comparing a phase of a feedback clock signal of the second internal clock signal with that of the first internal clock signal, determining which one of the feedback clock signal and the first internal clock signal is faster, and determining an amount of delay according to the determined clock signal.

Preferably, the delay locked loop (DLL) circuit further comprises a clock divider configured to receive an in-phase clock signal and an out-of-phase clock signal, and divide the received signal into a plurality of first clock signals, each of which has a phase difference of ¼ period.

In accordance with another aspect of the present invention, there is provided a delay locked loop (DLL) circuit comprising a first delay locked loop (DLL) for delaying first and second clock signals having a phase difference of ½ period, and generating first and second delay clock signals, and a second delay locked loop (DLL) for delaying the first and second delay clock signals, and generating third and fourth delay clock signals.

Preferably, the first delay locked loop (DLL) delays the first and second clock signals such that the first and second delay clock signals are synchronized with a reference clock signal.

Preferably, the third and fourth delay clock signals delay the first and second delay clock signals, such that the third and fourth delay clock signals have a phase difference of ¼ period as compared to the first and second delay clock signals.

BRIEF DESCRIPTION OF THE DRAWINGS

The above and other objects, features and other advantages of the subject matter of the present disclosure will be more clearly understood from the following detailed description taken in conjunction with the accompanying drawings, in which.

DETAILED DESCRIPTION OF PREFERRED EMBODIMENTS

Figure 1:
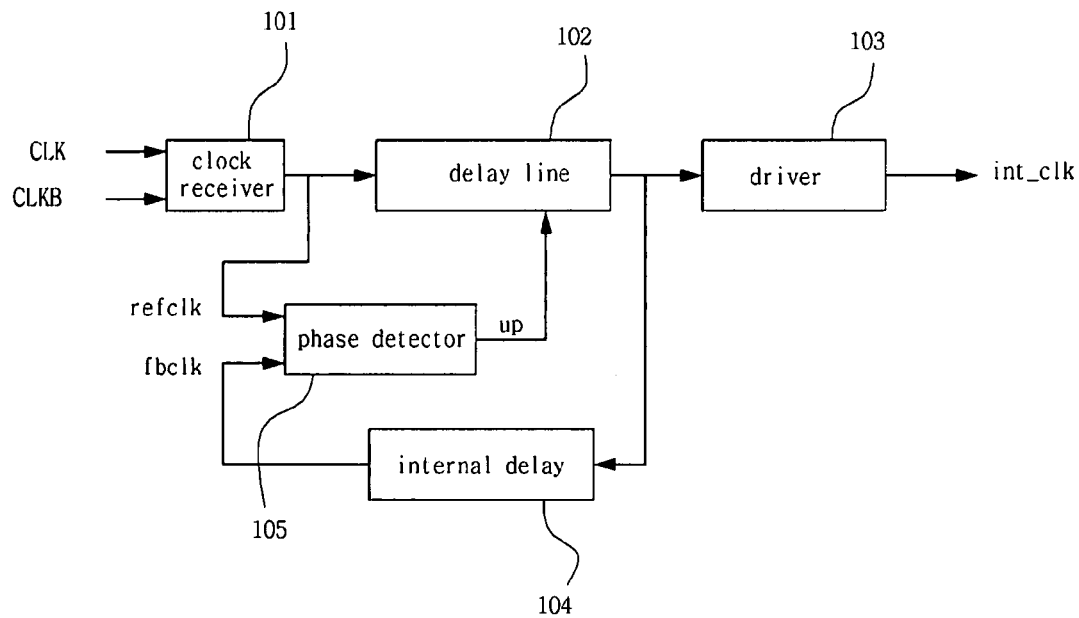
FIG. 1 is a block diagram illustrating a conventional delay locked loop (DLL)

Preferred embodiments of the present invention will now be described in detail with reference to the accompanying drawings. In the drawings, the same or similar elements are denoted by the same reference numerals even though they are depicted in different drawings. In the following description, a detailed description of known functions and configurations incorporated herein will be omitted when it may make the subject matter of the present invention rather unclear.

Prior to describing the preferred embodiments, it should be noted that all of constituent components contained in the delay locked loop (DLL) according to the preferred embodiments of the present invention are implemented with digital circuits, such that the delay locked loop (DLL) consumes a small amount of power, can easily cope with low-voltage and high-frequency operations, and can stably maintain the locking status.

Figure 2:
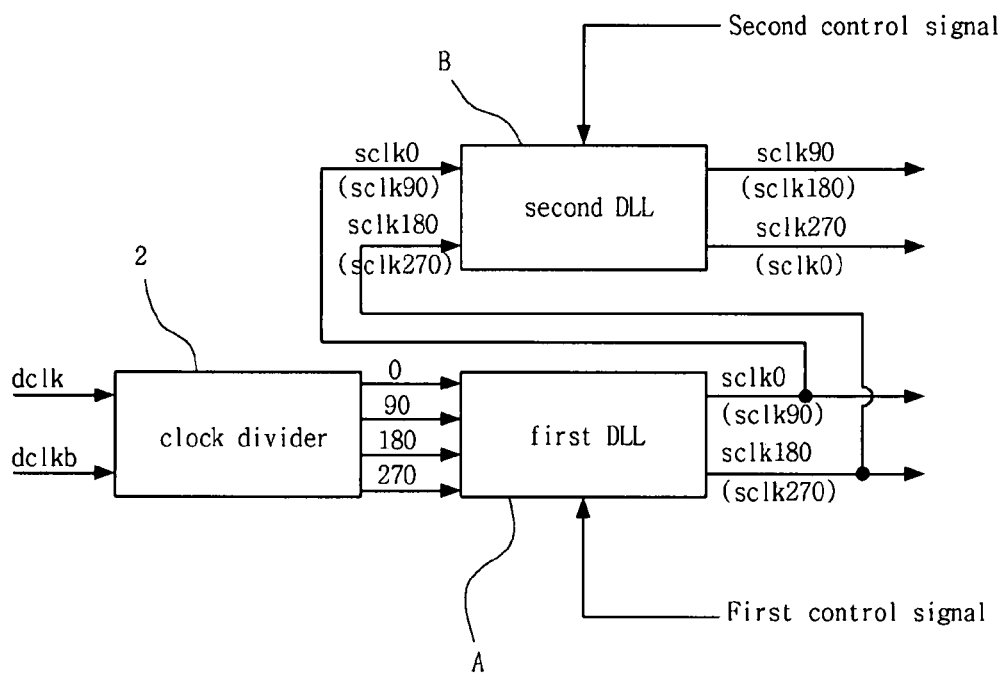
FIGS. 2 and 3 are block diagrams illustrating a delay locked loop (DLL) according to an embodiment of the present invention.
Figure 3:
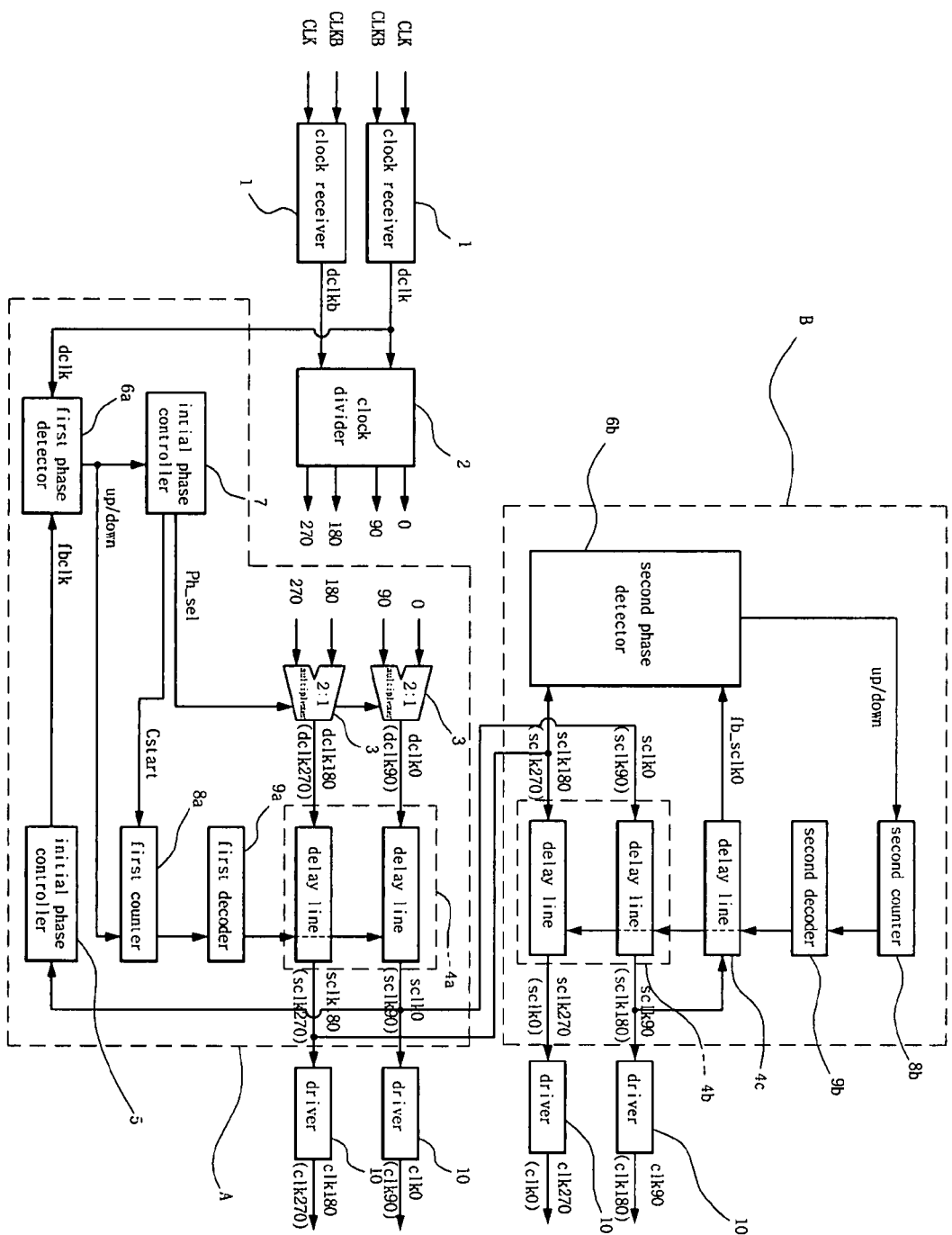

FIGS. 2 and 3 are block diagrams illustrating a delay locked loop (DLL) according to a preferred embodiment of the present invention.

Referring to FIGS. 2 and 3, the delay locked loop (DLL) according to a preferred embodiment of the present invention includes a first delay locked loop (DLL) A and a second delay locked loop (DLL) B.

The first delay locked loop (DLL) A receives a plurality of first clock signals (0, 90, 180, and 270), delays each of the first clock signals by a predetermined period of time in response to a first control signal, and generates a plurality of first internal clock signals (sclk0 and sclk180).

The second delay locked loop (DLL) B receives the first internal clock signals (sclk0 and sclk180), delays the first internal clock signals by a predetermined period of time in response to a second control signal, and generates a plurality of second internal clock signals (sclk90 and sclk270).

In this case, each of the first clock signals (0, 90, 180, 270) has a phase difference of ¼ period.

Each of the first internal clock signals (sclk0 and sclk180) has a phase difference of ½ period.

each of the second internal clock signals (sclk90 and sclk270) has a phase difference of ¼ period.

The first control signal is based on comparing a phase of a feedback clock signal of the first internal clock signal (fbclk) with that of a reference clock signal (dclk), determining which one of a feedback clock signal's phase and a reference clock signal's phase is faster, and determining an amount of delay according to the determined clock signal.

The second control signal is based on comparing a phase of a feedback clock signal of the second internal clock signal (sclk90) with that of the first internal clock signal (sclk180), determining which one of the feedback clock signal and the first internal clock signal is faster, and determining an amount of delay according to the determined clock signal.

The parenthesized clock signals of FIGS. 2 and 3 are indicative of clock signal generated by a multiplexer selection signal. The delay locked loop (DLL) according to the present invention controls the multiplexer to select the values of 0 and 180, and outputs the clock signals (dclk0 and dclk180).

The delay locked loop (DLL) according to a preferred embodiment of the present invention includes a clock receiver 1 and a clock divider 2.

The clock receiver 1 receives the external clock signals (CLK and CLKB), and generates an in-phase clock signal (dclk) and an out-of-phase clock signal (dclkb). The clock divider 2 receives the in-phase clock signal (dclk) and the out-of-phase clock signal (dclkb), and divides the received signals, that is, the in-phase clock signal (dclk) and the out-of-phase clock signal (dclkb), into 4 first clock signals (0, 90, 180, 270), each of which has a phase difference of ¼ period.

The delay locked loop (DLL) according to the preferred embodiment can further include a plurality of multiplexers 3. The multiplexers 3 receive the first clock signals (0, 90, 180, and 270), select the first clock signals (0, 90, 180, and 270) in response to the phase selection signal (Ph_sel), and output the selected first clock signals (0, 90, 180, and 270).

In addition, the delay locked loop (DLL) according to the preferred embodiment can include a first delay line group 4a. The first delay line group 41 receives the output signals (dclk0 and dclk180) of the multiplexer 3, delays the received signals (dclk0 and dclk180) by a predetermined period of time, and outputs the delayed signals.

The delay locked loop (DLL) according to the preferred embodiment can further include an internal delay 5. The internal delay 5 delays the phase clock signal (sclk0) generated from the first delay locked loop (DLL) by a predetermined period of time, generates a feedback clock signal (fbclk), and outputs the feedback clock signal (fbclk).

The delay locked loop (DLL) according to the preferred embodiment can additionally include a first phase detector 6a. The first phase detector 61 compares the phase of the feedback clock signal (fbclk) generated from the internal delay 5 with that of the clock signal (dclk) generated from the clock receiver 1, generates a first control signal (Up/Down) for increasing/reducing the delay line according to the comparison result, and outputs the first control signal (Up/Down).

The delay locked loop (DLL) according to the preferred embodiment can further include an initial phase controller 7. The initial phase controller 7 generates the phase selection signal (Ph_sel) and the counter start signal (Cstart) in response to the first control signal (Up/Down), and outputs the phase selection signal (Ph_sel) and the counter start signal (Cstart) to the multiplexers 3 and the first counter 8a.

In addition, the delay locked loop (DLL) according to the preferred embodiment can include a first counter 8a. The first counter 8a generates a signal for increasing/reducing the delay line 4 in response to the first control signal (Up/Down), and outputs the signal for increasing/reducing the delay line 4 in response to the counter start signal (Cstart).

The delay locked loop (DLL) according to the preferred embodiment can further include a first decider 9a. The first decoder 9a adjusts a delay amount of the first delay line group 4a in response to the above-mentioned delay line increasing/reducing signal of the first counter 8a, such that it can equally control all the delay lines.

The delay locked loop (DLL) according to the preferred embodiment can additionally include a second delay locked loop (DLL) group 4b. The second delay locked loop (DLL) 4b delays the output signals (sclk0 and sclk180) of the first delay locked loop (DLL) group 4a by a predetermined period of time, and outputs the delayed signals.

In addition, the delay locked loop (DLL) according to the preferred embodiment can include a delay line 4c. The delay line 4c delays one of the phase clock signals (sclk90) generated from the second delay locked loop (DLL) group 4b by a predetermined period of time, generates the second feedback clock signal (fb_sclk0), and outputs the second feedback clock signal (fb_sclk0).

The delay locked loop (DLL) according to the preferred embodiment can further include a second phase detector 6b. The second phase detector 6b compares the second feedback clock signal (fb_sclk0) with the phase clock signal (sclk180) generated from the second delay locked loop (DLL) group 4b, generates a second control signal (Up/Down) for increasing/reducing the delay line according to the comparison result, and outputs the second control signal (Up/Down).

The delay locked loop (DLL) according to the preferred embodiment can additionally include a second counter 8b and a second decoder 9b. The second counter 8b generates a signal for increasing/reducing the delay line in response to the second control signal. The second decoder 9b adjusts a second delay line according to the delay-line increasing/reducing signal of the second counter 8b, such that it can equally control the second delay locked loop (DLL) group 4b.

Figure 5:
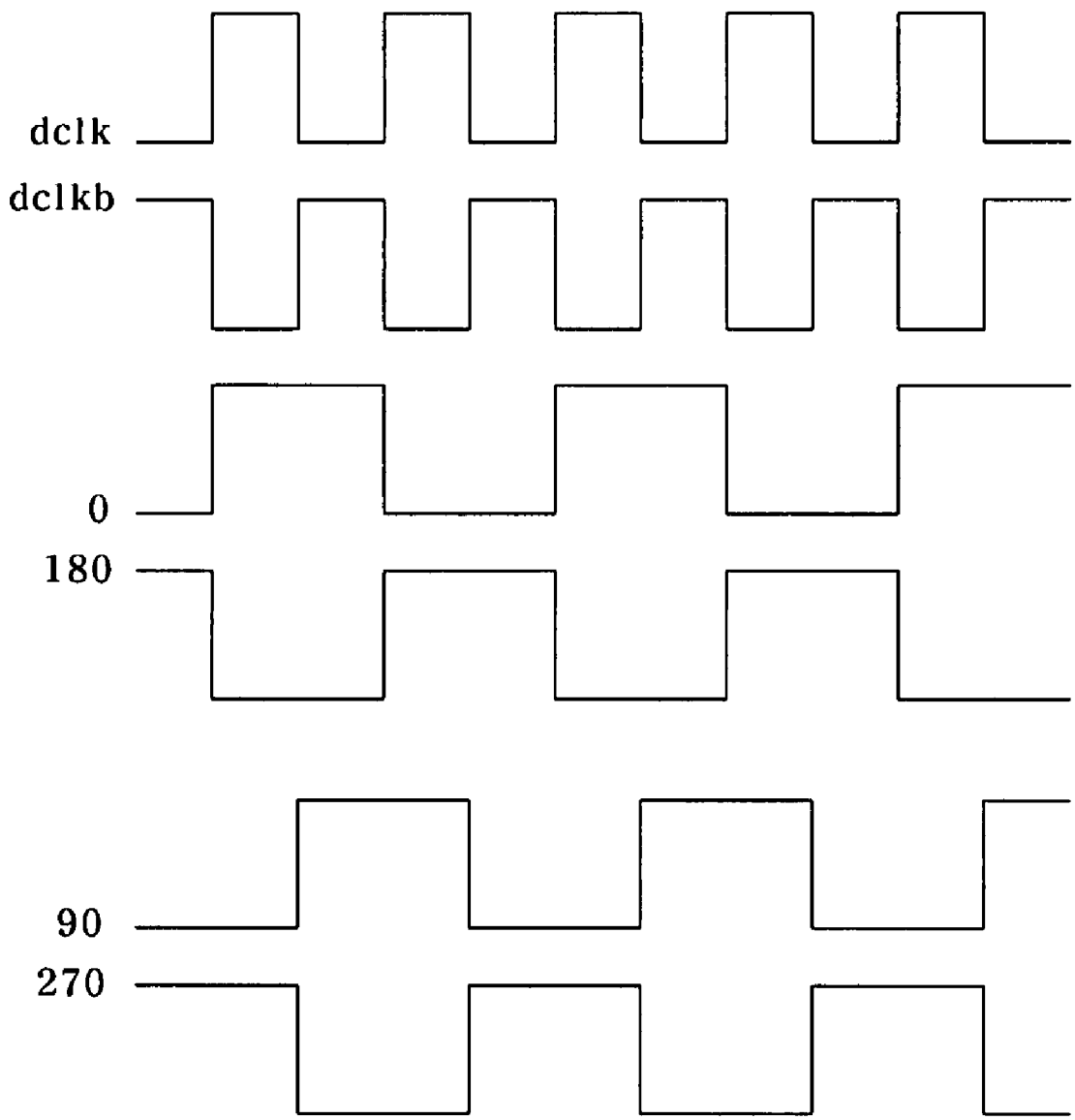
FIG. 5 is a timing diagram for the clock divider shown in FIG. 3.
Figure 6:
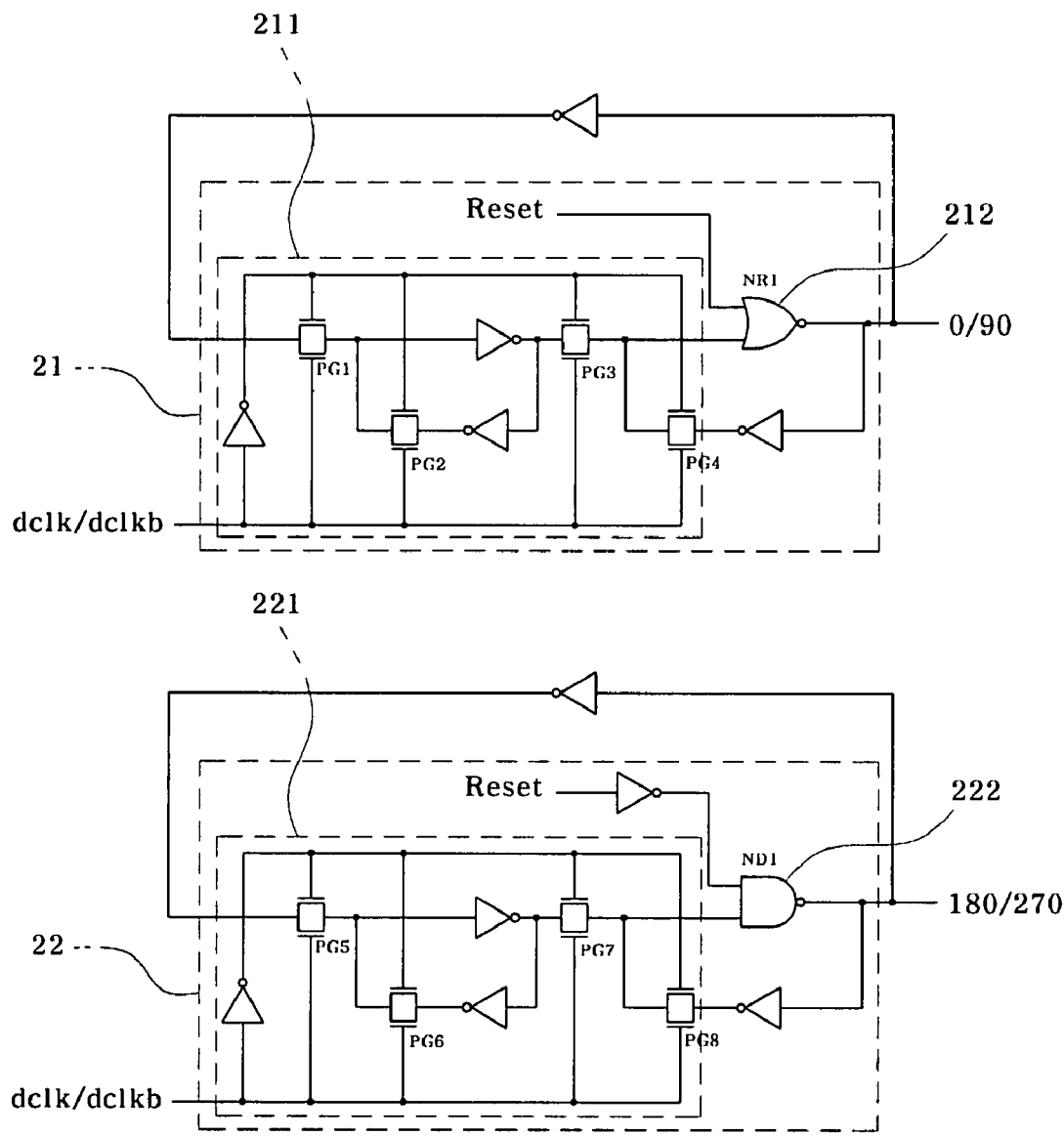
FIG. 6 is a circuit diagram illustrating an example of the clock divider shown in FIG. 3.

FIG. 5 is a timing diagram for the clock divider shown in FIG. 3. FIG. 6 is a circuit diagram illustrating more details of the clock divider shown in FIG. 3.

Referring to FIGS. 5 and 6, the clock divider 2 includes a first phase clock branch 21 and a second phase clock branch 22. The first phase clock branch 21 generates the 0-clock signal and the 90-clock signal in response to the in-phase clock signal (dclk), the out-of-phase clock signal (dclkb), and the reset signal (reset). The second phase clock branch 22 generates the 180-clock signal and the 270-clock signal in response to the in-phase clock signal (dclk), the out-of-phase clock signal (dclkb), and the reset signal (reset).

In this case, the first phase clock branch 21 initializes the received signal at a low output level upon receiving the reset signal (reset). The second phase clock branch 22 initializes the received signal at a high output level upon receiving the reset signal (reset).

The first phase clock branch 21 includes a first logic unit 211 and a second logic unit 212. The first logic unit 211 transmits/latches the phase clock signal in response to the internal clock signal. The second logic unit 212 performs a NOR operation between the phase clock signal of the first logic unit 211 and the reset signal (reset).

The second phase clock branch 22 includes a third logic unit 221 and a second logic unit 222. The third logic unit 221 transmits/latches the phase clock signal in response to the internal clock signal. The second logic unit 222 performs a NAND operation between the phase clock signal of the third logic unit 221 and the reset signal (reset).

According to the above-mentioned configurations, the clock divider 2 generates four clock signals (0, 90, 180, and 270), each of which has a phase difference of ¼ period.

Figure 4:
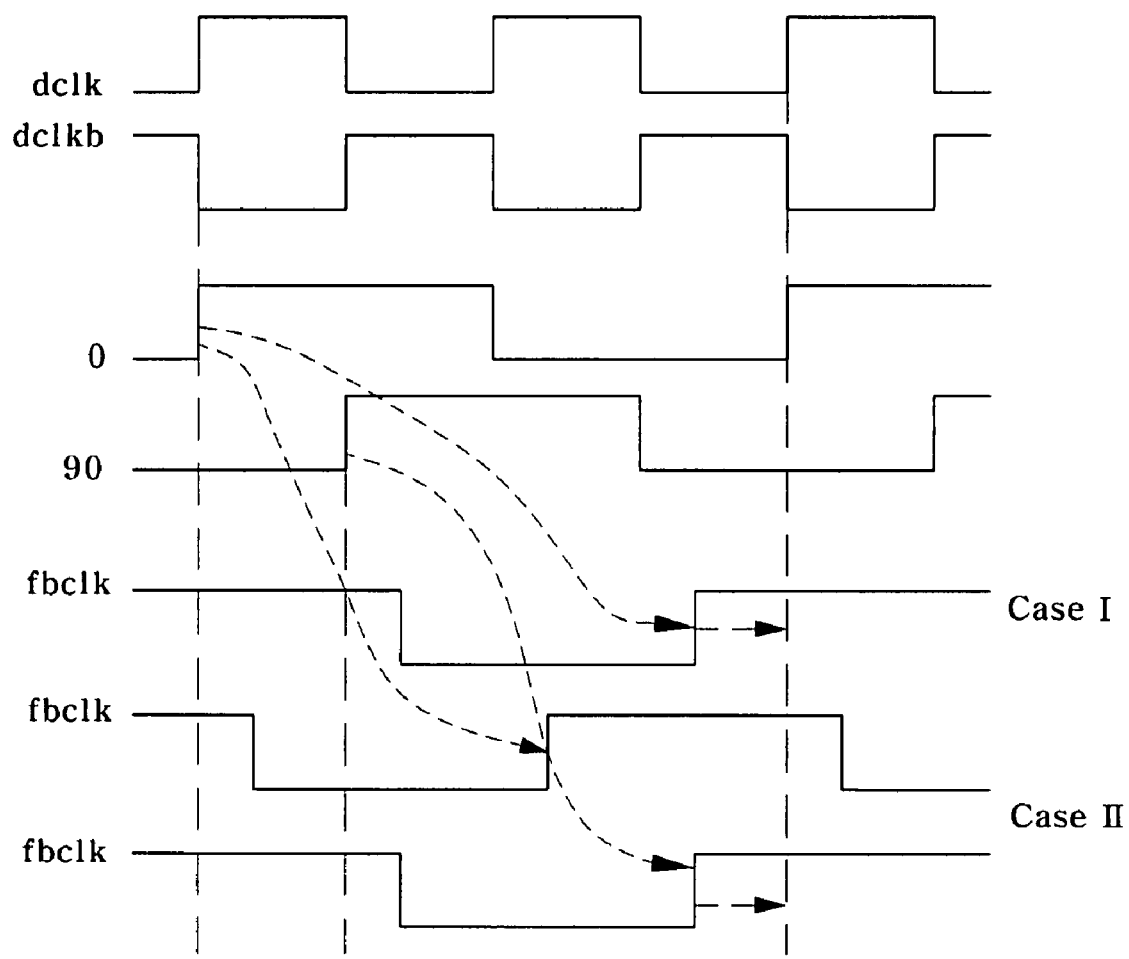
FIG. 4 is a timing diagram illustrating the operation principle of an initial phase controller shown in FIG. 3.
Figure 7:
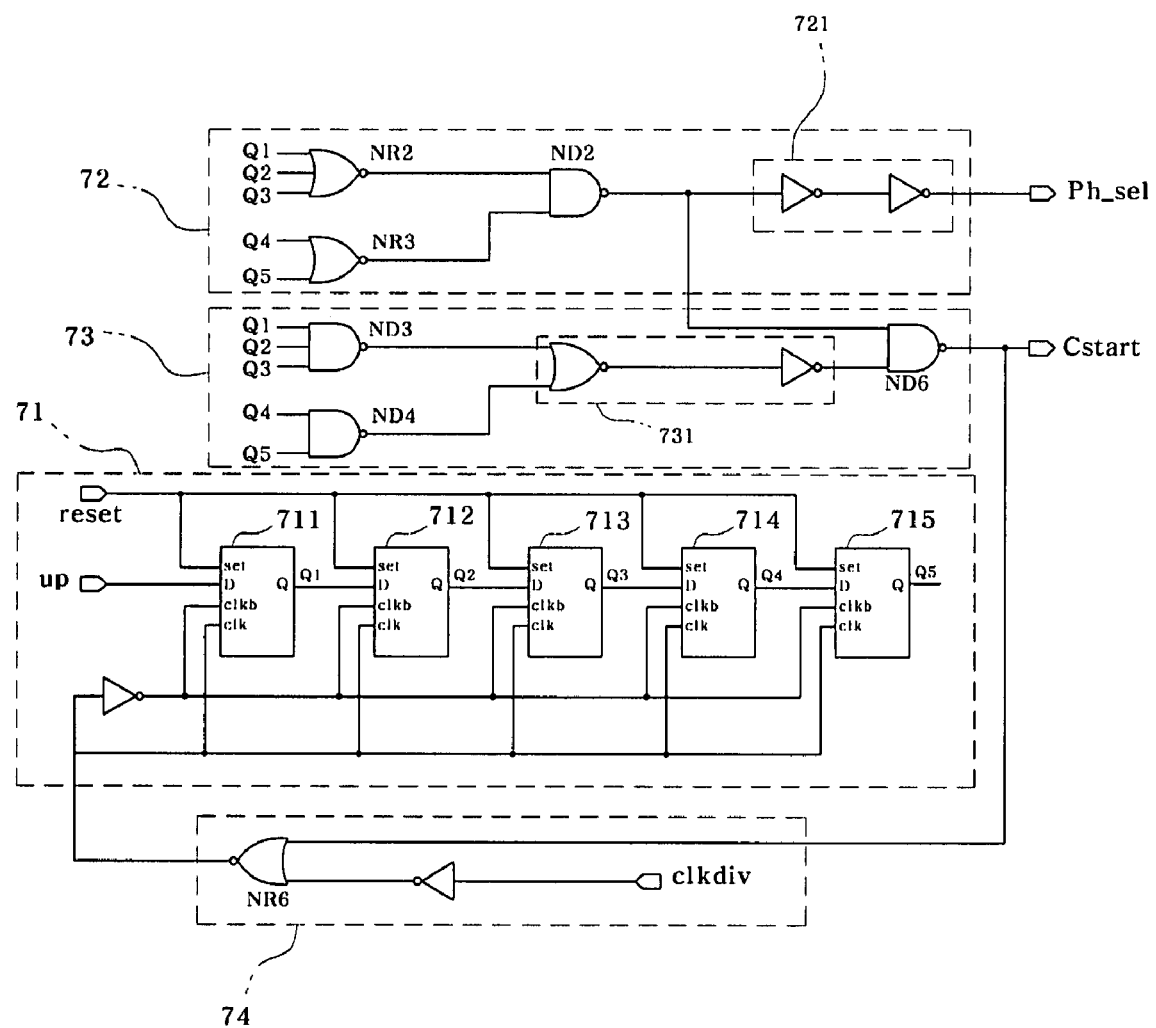
FIG. 7 is a detailed circuit diagram illustrating an example of the initial phase controller shown in FIG. 3.

FIG. 4 is a timing diagram illustrating the operation principle of the initial phase controller shown in FIG. 3. FIG. 7 is a detailed circuit diagram illustrating an example of the initial phase controller shown in FIG. 3.

Referring to FIGS. 4 and 7, the initial phase controller 7 generates first to fifth setup signals (Q1, Q2, Q3, Q4, and Q5) in response to the first control signal (Up/Down) and the clock signal (clkdiv).

Phase selection signal generator 72 generates a phase selection signal (Ph_sel) in response to the first to fifth setup signals (Q1, Q2, Q3, Q4, and Q5).

Start signal generator 73 generates a counter start signal (Cstart) in response to the first to fifth setup signals (Q1, Q2, Q3, Q4, and Q5).

Clock signal transmitter 74 transmits a clock signal (clkdiv) to the setup signal generator 71 in response to the counter start signal (Cstart).

In this case, the clock signal (clkdiv) can allow the first to fifth setup signals (Q1, Q2, Q3, Q4, and Q5) to be synchronized with the clock signal.

The setup signal generator 71 includes fifth to fifth flip-flops (711, 712, 713, 714, and 715) interconnected in the form of a serial connection, such that the flip-flops (711, 712, 713, 714, and 715) are synchronized with the clock signal (clkdiv) and generate the first to fifth setup signals, respectively. In this case, the control signal (Up/Down) is applied to the data input terminal of the first flip-flop 711.

The phase selection signal generator 72 generates the phase selection signal (Ph_sel) enabled when the first to fifth setup signals (Q1, Q2, Q3, Q4, and Q5) have the low logic level.

The phase selection signal generator includes a first logic unit (NR2), a second logic unit (NR3), a third logic unit (ND2), and a buffer 721.

The first logic unit (NR2) performs a NOR operation in response to the first to third setup signals (Q1, Q2, and Q3). The second logic unit (NR3) performs a NOR operation in response to the fourth to fifth setup signals (Q4 and Q5). The third logic unit (ND2) performs a NAND operation in response to output signals of the first and second logic units (NR2 and NR3), and generates the phase selection signal (Ph_sel). The buffer 721 buffers the phase selection signal (Ph_sel), and outputs the buffered signal.

In this case, the first and second logic units (NR2 and NR3) perform the NOR operation, and the third logic unit (ND2) performs the NAND operation.

The start signal generator 73 generates the start signal (Cstart) enabled when the first to fifth setup signals have the high logic level, and outputs the start signal (Cstart).

The start signal generator includes a fourth logic unit (ND3), a fifth logic unit (ND4), a sixth logic unit 731, and a seventh logic unit (ND6).

The fourth logic unit (ND3) performs a NAND operation in response to the first to third setup signals (Q1, Q2, and Q3). The fifth logic unit (ND4) performs a NAND operation in response to the fourth to fifth setup signals (Q4 and Q5). The sixth logic unit 731 performs a NOR operation in response to output signals of the fourth and fifth logic units (ND3 and ND4). The seventh logic unit (ND6) performs a NAND operation in response to output signals of the sixth logic unit 731 and the third logic unit (ND6), and generates the start signal.

In this case, the fourth logic unit (ND3), the fifth logic unit (ND4), and the seventh logic unit (NR5) perform the NAND operation, and the sixth logic unit 731 performs the NOR operation.

The clock signal generator 74 receives the buffering resultant signals of the start signal (Cstart) and the clock signal (clkdiv), and performs a logic operation on the buffering resultant signals. In this case, an additional logic unit (NR6) performs the NOR operation.

Operations of the above-mentioned delay locked loop (DLL) according to the preferred embodiments will hereinafter be described with reference to FIGS. 2 to 7.

As shown in FIG. 7, if operations of the delay locked loop (DLL) are reset at an initial operation time, the individual signals (Q1, Q2, Q3, Q4, and Q5) are changed to "H(high)", "L(low)", "L(low)", "L(low)", and "L(low)" levels, respectively. The phase selection signal (Ph_sel) is changed to the high level ("H"), the 2:1 multiplexer outputs the clock signals (dclk0 and dclk180). In this case, the start signal (Cstart) is changed to the low level signal "L", such that it prevents the counter from being operated, and the initial phase controller continues its own operations.

In the case of "Case I", if the rising edge of the feedback clock signal (fbclk) is located at the "L" level of the reference clock signal (dclk), the first control signal (Up) continuously outputs the "H" signal, and is synchronized with the clock signal (clkdiv), such that the signals (Q1, Q2, Q3, Q4, and Q5) are changed to the "H", "H", "H", "H", and "H" signals.

As a result, the phase selection signal (Ph_sel) maintains the "H" level, and the start signal (Cstart) is changed to the "H" signal, such that the "H" signal enables the counter to start operation, and the "H" signal prevents the initial phase controller from being operated.

In the case of "Case II", if the rising edge of the feedback clock signal (fbclk) is located at the "H" level of the reference clock signal (dclk), the first control signal (Up) continuously outputs the "L" signal, and is synchronized with the clock signal (clkdiv), such that the signals (Q1, Q2, Q3, Q4, and Q5) are changed to the "L", "L", "L", "L", and "L" signals.

As a result, the phase selection signal (Ph_sel) is changed to the "L" signal, the start signal (Cstart) is changed to the "H" signal, such that the "H" signal enables the counter to start operation, and the "H" signal prevents the initial phase controller from being operated.

Subsequently, as can be seen from FIGS. 2 and 3, the clock receiver 1 receives the external clock signals (CLK and CLKB), and generates the in-phase clock signal (dclk) and the out-of-phase clock signal (dclkb). The clock divider 2 receives the output signal of the clock receiver 1, and generates 4 phase clock signals (0, 90, 180, and 270), each of which has a phase difference of ¼ period.

In this case, as shown in FIGS. 5 and 6, the clock divider 2 receives the clock signals (dclk and dclkb) via the first phase clock branch 21, and generates the 0-clock signal and the 90-clock signal in response to the clock signals (dclk and dclkb). The clock divider 2 receives the clock signals (dclk and dclkb) via the second phase clock branch 22, and generates the 180-clock signal and the 270-clock signal in response to the clock signals (dclk and dclkb). In this case, the first phase clock branch 21 initializes the received signal at a low output level upon receiving the reset signal (reset). The second phase clock branch 22 initializes the received signal at a high output level upon receiving the reset signal (reset).

The multiplexers 3 receive the phase clock signals (0, 90, 180, and 270), and output the clock signals (dclk0 and dclk180) in response to the phase selection signal (Ph_sel). The delay line group 4a delays the clock signals (dclk0 and dclk180) by a predetermined period of time, and outputs the delayed signals (sclk0 and sclk180).

Particularly, the internal delay 5 delays the clock signal (sclk0) by a predetermined period of time, and outputs the feedback clock signal (fbclk).

The first phase detector 6a compares the phase of the feedback clock signal (fbclk) generated from the internal delay 5 with that of the in-phase clock (dclk) generated from the clock receiver 1, and generates a first control signal (Up/Down) for increasing/reducing the delay line according to the comparison result.

The initial phase controller 7 generates the phase selection signal (Ph_sel) and the counter start signal (Cstart) in response to the first control signal (Up/Down), outputs the phase selection signal (Ph_sel) to the multiplexers 3, and outputs the counter start signal (Cstart) to the first counter 8a.

In this case, the initial phase controller 7 responds to the first control signal (up/down) and the clock signal (clkdiv) via the setup signal generator 71, and generates the first to fifth setup signals (Q1, Q2, Q3, Q4, and Q5). The initial phase controller 7 generates the phase selection signal (Ph_sel) in response to the first to fifth setup signals (Q1, Q2, Q3, Q4, and Q5) via the phase selection signal generator 72.

The initial phase controller 7 generates the counter start signal (Cstart) in response to the first to fifth setup signals via the start signal generator 73. In this case, the clock signal transmitter 74 transmits the clock signal (clkdiv) to the setup signal generator 71 in response to the start signal (Cstart).

The first counter 8a generates a signal for increasing/reducing the delay line 4 in response to the first control signal (Up/Down), and outputs the delay-line increasing/reducing signal in response to the counter start signal (Cstart).

The first decoder 9a adjusts a delay amount of the first delay line group A in response to the delay-line increasing/reducing signal of the first counter 8a.

The second delay line group 4b receives the phase clock signal (sclk0) from the first delay line group 4a, delays the received signal by a second delay period, and outputs the delayed resultant signal. Thereafter, the second delay line group 4b generates the feedback clock signal (fb_sclk0) via the delay line 4c.

The second phase detector 6b compares the phase of the second feedback clock signal (fb_sclk0) with that of the phase clock signal (sclk180) generated from the first delay line group 4a, and generates the second control signal (up/down) for increasing/reducing the delay line according to the comparison result.

Thereafter, the second counter 8b generates the delay-line increasing/reducing signal in response to the second control signal. The second decoder 9b adjusts the second delay period according to the delay-line increasing/reducing signal of the second counter 8b, and equally controls the second delay line group 4b.

In other words, the delay locked loop (DLL) according to the preferred embodiments of the present invention compares the phase of the clock signal (sclk180) with that of the feedback clock signal (fb_sclk0), and adjusts a delay amount of the second delay line group 4b via the second counter 8b and the second decoder 9b.

As described above, the delay locked loop (DLL) circuit capable of generating the internal clock signals (clk0, clk90, clk180, and clk270), each of which has a phase difference of ¼ period, is implemented with a digital circuit, such that it can be easily operated at a low voltage and a high frequency.

Although preferred embodiments of the present invention have been disclosed for illustrative purposes, those skilled in the art will appreciate that various modifications, additions and substitutions are possible, without departing from the scope and spirit of the invention as disclosed in the accompanying claims.

The present application claims priority to Korean patent application number 10-2006-0138764, filed Dec. 29, 2006, which is incorporated by reference in its entirety.

What is claimed is:

1. A delay locked loop (DLL) circuit comprising:
   a first delay locked loop (DLL) configured to receive a plurality of first clock signals respectively having a phase difference of a first predetermined period of time, delay each of the first clock signals by a second predetermined period of time in response to a first control signal, and generate a plurality of first internal clock signals; and a second delay locked loop (DLL) configured to receive the first internal clock signals, delay the first internal clock signals by a third predetermined period of time in response to a second control signal, and generate a plurality of second internal clock signals.

2. The delay locked loop (DLL) circuit according to claim 1, wherein the first predetermined period is ¼ period.

3. The delay locked loop (DLL) circuit according to claim 1, wherein each of the first internal clock signals has a phase difference of ½ period.

4. The delay locked loop (DLL) circuit according to claim 1, wherein each of the second internal clock signals has a phase difference of ½ period.

5. The delay locked loop (DLL) circuit according to claim 1, wherein the first control signal is based on comparing a phase of a feedback clock signal of the first internal clock signal with that of a reference clock signal, determining which one of the phase of the feedback clock signal and the phase of the reference clock signal is faster, and determining an amount of delay according to the faster clock signal phase.

6. The delay locked loop (DLL) circuit according to claim 1, wherein the second control signal is based on comparing a phase of a feedback clock signal of the second internal clock signal with that of the first internal clock signal, determining which one of the feedback clock signal and the first internal clock signal is faster, and determining an amount of delay according to the determined clock signal.

7. The delay locked loop (DLL) circuit according to claim 1, further comprising:
a clock divider configured to receive an in-phase clock signal and an out-of-phase clock signal, and divide the received signal into a plurality of first clock signals, each of which has a phase difference of ¼ period.

8. The delay locked loop (DLL) circuit according to claim 1, wherein the first delay locked loop (DLL) includes:
a plurality of multiplexers for selecting the first clock signals in response to a phase selection signal, and generating the selected first clock signals;
a first delay line group for delaying the output signals of the multiplexers by the second predetermined period of time, and generating the first internal clock signals;
a first phase detector for comparing a phase of a feedback clock signal acquired when one of the first internal clock signals is delayed by a fourth predetermined period of time, with a phase of a reference clock signal, and generating the first control signal according to the comparison result; and
an initial phase controller for generating the phase selection signal in response to the first control signal, and outputting the phase selection signal to the multiplexers.

9. The delay locked loop (DLL) circuit according to claim 8, wherein the phase selection signal is an information signal for selecting one of the first clock signals based on a phase comparison result between the feedback clock signal and the reference clock signal.

10. The delay locked loop (DLL) circuit according to claim 8, wherein the initial phase controller includes:
a setup signal generator for generating first to fifth setup signals in response to the first control signal;
a phase selection signal generator for generating a phase selection signal in response to the first to fifth setup signals; and a start signal generator for generating a counter start signal in response to the first to fifth setup signals.

11. The delay locked loop (DLL) circuit according to claim 10, wherein the setup signal generator includes a plurality of flip-flops interconnected in the form of a serial connection, such that the flip-flops are synchronized with an external clock signal and generate the first to fifth setup signals, in which
the first control signal is transmitted to a data input terminal of the first flip-flop.

12. The delay locked loop (DLL) circuit according to claim 10, wherein the phase selection signal generator includes:
a first logic unit for performing a NOR operation in response to the first to third setup signals;
a second logic unit for performing a NOR operation in response to the fourth and fifth setup signals; and
a third logic unit for performing a NAND operation in response to output signals of the first and second logic units.

13. The delay locked loop (DLL) circuit according to claim 10, wherein the start signal generator includes:
a fourth logic unit for performing a NAND operation in response to the first to third setup signals;
a fifth logic unit for performing a NAND operation in response to the fourth and fifth setup signals;
a sixth logic unit for performing a NOR operation in response to output signals of the fourth and fifth logic units; and
a seventh logic unit for performing a NAND operation in response to output signals of the sixth logic unit and the phase selection signal generator.

14. The delay locked loop (DLL) circuit according to claim 1, wherein the second delay locked loop (DLL) includes:
a second delay locked loop (DLL) group for delaying each of the first internal clock signals by the third predetermined period of time in response to the second control signal, and generating the second internal clock signals; and
a second phase detector for comparing a phase of a feedback clock acquired when one of the second internal clock signals is delayed by a fourth predetermined period of time, with a phase of a reference clock signal, and generating a second control signal according to the comparison result.

15. The delay locked loop (DLL) circuit according to claim 14, wherein each of the first internal clock signals has a phase difference of ½ period.

16. The delay locked loop (DLL) circuit according to claim 14, wherein each of the second internal clock signals has a phase difference of ½ period.

17. The delay locked loop (DLL) circuit according to claim 14, wherein the second control signal compares a phase of a feedback clock signal of the second internal clock signal with that of the first internal clock signal, determines which one of the feedback clock signal and the first internal clock signal is faster, and determines an amount of delay according to the determined clock signal.

18. A delay locked loop (DLL) circuit comprising:
a plurality of multiplexers for selecting and outputting a first clock signal or a second clock signal in response to a phase selection signal, the first and second clock signals having a phase difference of ½ period;
a first delay line for delaying output signals of the multiplexers by a first predetermined period of time, and generating first internal clock signals;
a first phase detector for comparing a phase of a feedback clock signal acquired when one of the first internal clock signals is delayed by a second predetermined period of time, with a phase of a reference clock signal, and generating a first control signal according to the comparison result;

an initial phase controller for generating the phase selection signal in response to the first control signal, and outputting the phase selection signal to the multiplexers; and a second delay line for delaying the first internal clock signal by a third predetermined period of time, and generating a second internal clock signal.

19. The delay locked loop (DLL) circuit according to claim 15, wherein the first internal clock signal is synchronized with the reference clock signal.

20. The delay locked loop (DLL) circuit according to claim 18, further comprising:

a second phase detector for comparing the phase of the feedback clock signal acquired when one of the second internal clock signals is delayed by a fourth predetermined period of time, with a phase of the first internal clock signal, and generating a second control signal according to the comparison result, wherein the second control signal controls the third predetermined period of time.

\* \* \* \* \*